US007386813B2

(12) United States Patent
Singh et al.

(10) Patent No.: US 7,386,813 B2
(45) Date of Patent: Jun. 10, 2008

(54) TRANSFORMATION OF SIMPLE SUBSET OF PSL INTO SERE IMPLICATION FORMULAS FOR VERIFICATION WITH MODEL CHECKING AND SIMULATION ENGINES USING SEMANTIC PRESERVING REWRITE RULES

(75) Inventors: Vinaya K. Singh, Noida (IN); Tarun Garg, Rohini (IN)

(73) Assignee: Cadence Design Systems, Inc., San Jose, CA (US)

( * ) Notice: Subject to any disclaimer, the term of this patent is extended or adjusted under 35 U.S.C. 154(b) by 127 days.

(21) Appl. No.: 11/001,327

(22) Filed: Nov. 30, 2004

(65) Prior Publication Data

US 2006/0136879 A1 Jun. 22, 2006

(51) Int. Cl.
*G06F 17/50* (2006.01)

(52) U.S. Cl. .......................................................... 716/3

(58) Field of Classification Search .................. 716/3–5
See application file for complete search history.

(56) References Cited

FOREIGN PATENT DOCUMENTS

WO 2006035854 A1 4/2006

OTHER PUBLICATIONS

Tuerk et al., "From PSL to LTL: A Formal Validation in HOL", International Conference on Theorem Proving in Higher Order Logics (TPHOL), Aug. 22, 2005, pp. 342-357.*
Beer et al., "The Temporal Logic Sugar", 13th Conference on Computer-Aided Verification, Jul. 2001, pp. 363-367.*
Gawanmeh et al., "Embedding and Verification of PSL using AsmL", 12th International Workshop on Abstract State Machines, Mar. 2005, pp. 201-216.*
Datta et al., "Assertion Based Verification Using HDVL", 17th International Conference on VLSI Design, Jan. 2004, pp. 319-325.*
Georghita et al., "Constructing Checkers from PSL Properties", Proc. of the 15th International Conference on Control Systems and Computer Science, May 2005, pp. 757-762.*
Pacholik et al., "Real Time Constraints in System Level Specifications Improving the Verification Flow of Complex Systems", Net. ObjectDays conference, Sep. 2005.*
Gordon, "Validating the PSL/Sugar semantics using automated reasoning", Formal Aspects of Computing, vol. 15, No. 4, Dec. 2003, pp. 406-421.*
International Search Report for related application PCT/US2005/042932 mailed on Jul. 3, 2006.
Beer, I. et al., "*The Temporal Logic Sugar*", Proceedings of the 13th Conference on Computer-Aided Verification (CAV '00), Jul. 2001, pp. 363-367, vol. 2102 of Lecture Notes in Computer Science, Springer-Verlag, London, UK.

(Continued)

*Primary Examiner*—Jack Chiang
*Assistant Examiner*—Brandon W. Bowers
(74) *Attorney, Agent, or Firm*—Bingham McCutchen LLP

(57) ABSTRACT

The disclosure presents a formulation to support simulatable subset (also known as 'simple-subset') of a property specification language. This method is applicable for model checking and simulation. In this formulation, the 'simple-subset' is transformed to a set of basic formulas. Verification engines are required to support the basic formula only. The basic formula is a form of automata in the property specification language. This is called SERE implication. The efficiency of verification is dependent on size of automata. Miscellaneous opportunistic rules are applied to optimize SERE implication formulas.

53 Claims, 7 Drawing Sheets

OTHER PUBLICATIONS

Datta, K. et al., "*Assertion Based Verification Using HDVL*", Proceedings of 17th International Conference on VLSI Design (VLSID '04), Jan. 2004, pp. 319-325, IEEE Computer Society, USA.

Gawanmeth, A. et al., "*Embedding and Verification of PSL Using AsmL*", Proceedings of the International Conference on Abstract State Machines (ASM'05), Mar. 2005, pp. 201-216, Paris, France.

Gheorghita, S. V. et al., "*Constructing Checkers From PSL Properties*", Proceedings of the 15th International Conference on Control Systems and Computer Science 2, May 2005, pp. 757-762, ES [06.11], The Netherlands.

Gordon, M. J. C., "*Validating the PSL/Sugar Semantics Usng Automated Reasoning*", Formal Aspects of Computing, Dec. 2003, pp. 406-421, vol. 4, Springer London, UK.

Pacholik, A.; et al., "*Real Time Constraints in System Level Specifications Improving the Verification Flow of Complex Systems*", In: Proceedings of Net.ObjectDays 2005, Sep. 19-22, 2005, pp. 283-294.

Tuerk, T. et al., "*From PSL to LTL: A Formal Validation in HOL*", Proceedings of the International Conference on Theorem Proving in Higher Order Logics (TPHOL), Aug. 22, 2005, pp. 342-357, Springer-Verlag, Germany.

Accellera "Property Specification Language Reference Manual Version 1.1", Jun. 2004, pp. 1-131, located at http://www.eda.org/vfv/docs/PSL-v1.1.pdf.

Beer, I. et al. "On-the-fly model checking of RCTL formulas" 10th International Conference on Computer Aided Verification (CAV '98), 1998, pp. 1-12, located at http://www.research.ibm.com/haifa/projects/verification/RB_Homepage/ps/ag-bool_f.ps.

Ben-David, S. et al. "Automata construction for regular expressions in model checking" pp. 1-12, located at http://www.wisdom.weizmann.ac.il/{dana/publicat/pos-nfa.pdf.

Datta, K. et al. "Assertion based verification using HDVL" Proceedings of the 17th International Conference on VLSI Design, Mumbai, India, Jan. 5-9, 2004, pp. 319-325.

Gordon, M.J.C. "Validating the PSL/sugar semantics automated reasoning" Formal Aspects of Computing, Springer-Verlag, UK, Dec. 2003, vol. 15, No. 4, pp. 406-421.

Maidl, M. "Common fragment of CTL and LTL" Proceedings of the 2000 IEEE Annual Symposium on Foundations of Computer Science, Los Alamitos, CA, 2000, pp. 643-652.

Ruah, S. et al. "Automata construction for on-the-fly model checking PSL safety simple subset" pp. 1-22, located at http://www.wisdom.weizmann.ac.il/{dana/publicat/safety_psi_det.pdf.

Supplemental Search Report dated Mar. 1, 2007 for European Application No. 05852297.0.

* cited by examiner

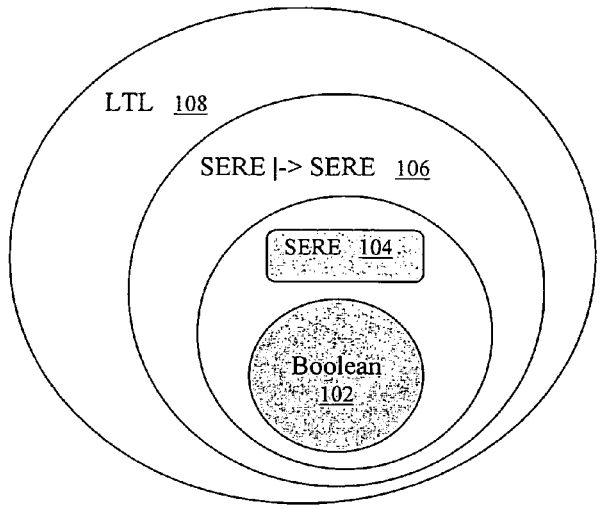
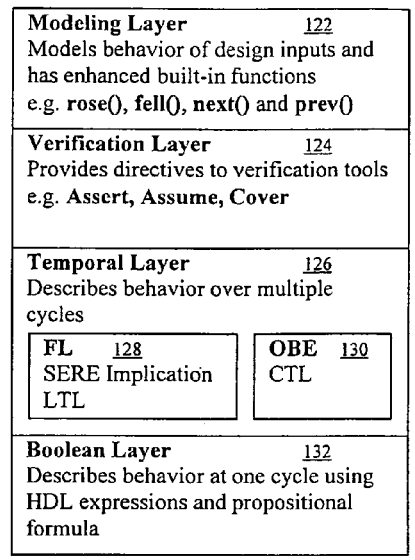
FIG. 1B
FIG. 1A
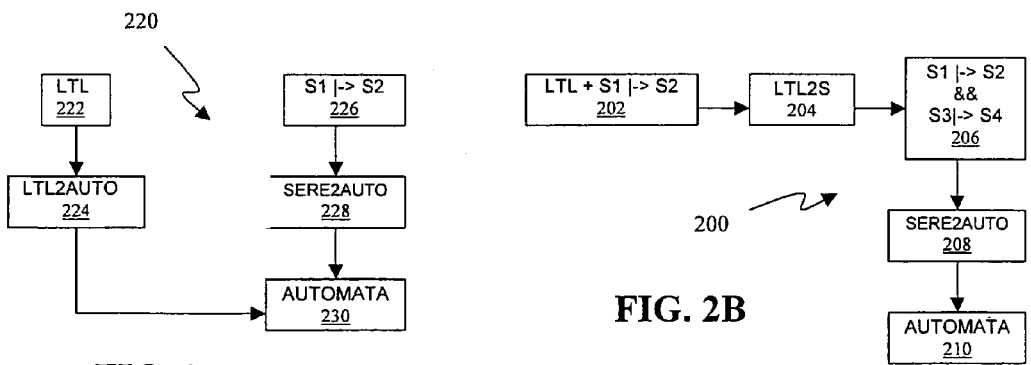
FIG. 2A
FIG. 2B

{S1} |-> {S2}

For all ω1 ε S1 Ξ ω2 such that
ω2 ε S2   OR   ω2: ω3 ε S2, ω1: ω2= ω

Rule 5

Rule 6

Rule 7

{S1 abort b} |-> {S2 abort b}

For all $\omega 1 \; \varepsilon \; S1 \; \Xi \; \omega 2$ such that
$\omega 2 \; \varepsilon \; S2$ OR $\omega 2: \omega 3 \; \varepsilon \; S2, \omega 1: \omega 2 = \omega$ Rule 11

Rule 12

Rule 13

TRANSFORMATION OF SIMPLE SUBSET OF PSL INTO SERE IMPLICATION FORMULAS FOR VERIFICATION WITH MODEL CHECKING AND SIMULATION ENGINES USING SEMANTIC PRESERVING REWRITE RULES

BACKGROUND AND SUMMARY

Confirming that a circuit design satisfies the specified requirements is the basis of verification processes. One main aspect of the verification process includes specification. Conventional specification practices include creating a natural language description of a circuit's design requirements. However, the natural language description lacks a machine-executable representation, which is usually vague and in many cases unverifiable. In addition, in recent years, the demand for formal specification languages is growing as more and more engines capable of handling formal verification languages become available in verification environments. All the advances require a more sophisticated property specification language.

PSL is an Accellera Standard language for property specification. It is used for specifying hardware design behavior and interface requirements. The PSL specification can be used in simulation, emulation, and model checking (formal) verification engines to check the hardware design.

The language PSL, supports linear temporal logic (LTL) and computational tree logic (CTL) formulas. It has unique regular expression based formula called SERE (Sugar Extended Regular Expressions) implication. The LTL and SERE forms together are called foundation language (FL) formulas. The language defines subset of FL, which can also be verified using simulation. This subset is called 'simple-subset' of PSL. The disclosure presents a novel method to support 'simple-subset' of PSL by simulation and model checking.

Buchi Automata is a well-studied form of automata to represent LTL formulas in LTL model checking. The LTL formulas are converted to Buchi Automata. The standard model checking consists of taking cross product of model (design automaton) and Buchi automation of the complement of LTL formula. The cross product is checked for empty language. The Buchi automata could have $O(2^n)$ states in worst-case where n is the size of LTL formula. The size of Buchi automation, and hence the quality of LTL formula transformation, is very important for efficiency of model checking. This process is shown in FIG. 2A and described further below.

Formula in 'simple-subset' of PSL can be transformed to a set of SERE implication formulas with optional 'abort'. This disclosure describes a method to show that SERE implication support is powerful enough to support 'simple-subset' of PSL.

Efficiency of automata construction is addressed by two approaches. Handcrafted parameterized automation modules are constructed for generic SEREs. These are specific to modeling checking and simulation engines. In addition, transformation rules have been developed to optimize SEREs before implementing it with automatons for simulation and model checking.

BRIEF DESCRIPTION OF THE DRAWINGS

FIG. 1A is a representation of the PSL layers.
FIG. 1B is a representation of simple-subset layers.
FIG. 2A is a representation of conversion of LTL formula and SERE implication into automation.
FIG. 2B is a representation of conversion to automata using shared SERE2AUTO.

DETAILED DESCRIPTION

Figure 3:
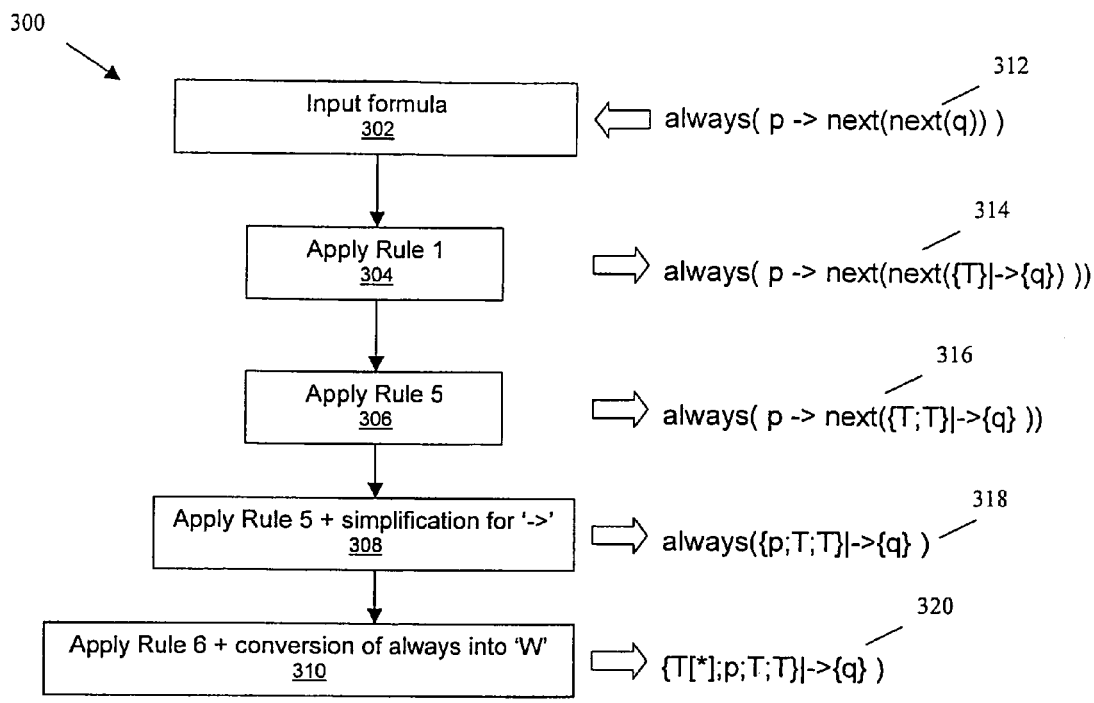
FIG. 3 is a representation of the LTL2S process.

This disclosure demonstrates a method to represent PSL specification for simulation and model checking, however the method is also applicable for emulation engines and other assertion languages like System Verilog Assertions (SVA) and Linear Temporal Logic (LTL). This discloser, describes embodiments using PSL 1.01 and LTL as an example, but is not meant to limit the scope of the claims. The embodiments are described in details for application in simulation and model checking. Extension of this method to emulation and assertion languages is described in paragraphs [0066]-[0067].

PSL consists of four layers as shown in FIG. 1A: boolean 132, temporal 126, verification 124, and modeling 122 layers. Boolean layer 132 uses Hardware Description Language (HDL) expressions to describe propositional formula. The propositional formula describes behavior at a cycle of a path. Temporal layer 126 describes behavior over multiple cycles of a path. Temporal layer has SERE implication, LTL, and CTL formulas. SERE implication and LTL formulas are grouped together and called PSL FL formula 128. A subset of FL, which is amenable for simulation, is called 'simple-subset'. However, the CTL portion 130 is amenable for formal verification tools only. This is called optional branching extension (OBE) of temporal layer.

Modeling and Verification Layers of PSL

Modeling layer 122 provides a way to model behavior of design inputs which are also known as design environment or constraints. In an embodiment synthesizable subset of HDL can also be used to model behavior of design inputs. Some extensions have been done in Verilog to facilitate environment modeling. These extensions include non-determinism and data type enhancements. Built-in functions rose( ), fell( ), next( ) and prev( ) have been added to enhance boolean expressions.

Verification layer 124 has directives to provide instructions to verification tools. The following are commonly used verification directives.

Assert: Check that the property holds.
Example: assert never (read_enable AND write_enable);
Assume: Assume that the property holds (i.e. ignore computations paths on which it doesn't). In simulation assume directive is treated as assert directive only.
Example: assume always (req→eventually! (!busy));
Cover: Check that the sequence occurs at least once along a path.
Example: cover {req; busy[*]; cancel};.

The 'Simple-Subset' of PSL-FL

An FL formula is made of boolean expressions, SERE implications and LTL operators. SERE implication is a regular expression-based formulation introduced in PSL. The semantics are discussed in the 'SERE Implication' section. A representation of the simple-subset layers is shown in FIG 1B. The Boolean layer 102 is in the core of formulas and uses HDL or PSL boolean expressions to describe propositional formulas. A boolean expression is a propositional formula which describes the design behavior at a cycle. The SERE layer 104 captures the multi-cycle behavior and is made of a sequence of boolean expressions. SEREs are used in implication and LTL operators to form FL formula. The SERE implication layer 106 (SERE|→SERE) uses the SEREs to form a PSL formula. The outermost layer 108 shows the LTL operators, which are applied to the Boolean, SEREs and SERE Implications for further compositioning of a formula.

LTL operators and SERE implication describe temporal behavior on an execution path. In simulation, the test bench defines an execution path. Hence, formulas are evaluated with respect to a test bench. In formal verification, execution paths are defined with respect to environmental constraints. The formulas are evaluated in all execution paths, which do not violate the constraints.

In simulation, time advances monotonically along a single path. The 'simple-subset' conforms to monotonic advancement of time. The FL semantics is defined on an execution path.

The 'simple-subset' of PSL FL has following primary restrictions:

Negation is applied only to booleans.

Left hand side of logical operators and, or, and implication, are boolean.

Right hand side of 'until' and 'until!' operator are boolean.

'Never' and 'eventually!' are applied to boolean or SERE only.

Both operands of logical operator 'iff' and temporal operator 'before' are boolean.

Semantics of the operators in 'simple-subset' is described in the PSL FL to SERE Implication section below (paragraphs 0045-0061).

SERE Implication

SERE provides a mechanism to code any arbitrary regular expression. SERE in itself is not a property. SERE implication ('|→') is a basic operator to form an FL property using SEREs. For example, FIG. 2B shows process 200, a conversion to automata using shared SERE2AUTO. Process 200 takes an expression 202 and uses LTL to SERE implication, or LTL2S 204, to create expression 206. Process action 208 uses SERE2AUTO to convert to automata 210. SERE2AUTO is shared between LTL and SERE implication formula.

Figure 4:
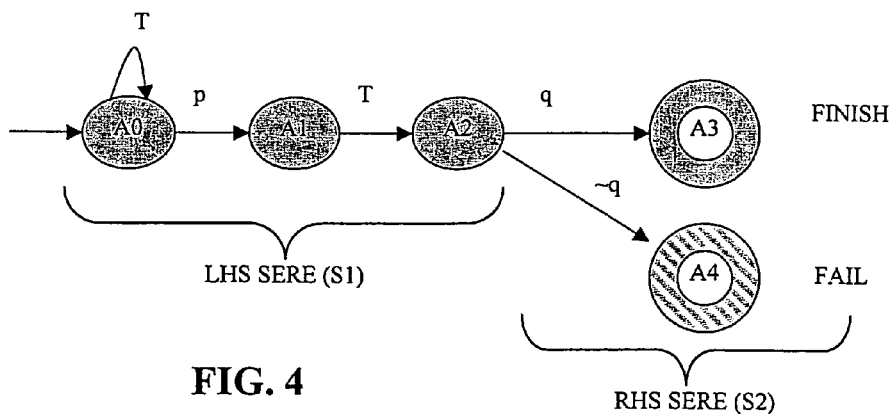
FIG. 4 is an example of the SERE2AUTO process.

Using LTL2S is an alternative to the existing process of using LTL2AUTO as shown in process 220 in FIG. 2A. The LTL formula 222 is converted using process LTL2AUTO 224 to automata 230, while formula S1|→S2 226 is converted using process SERE2AUTO 228 to automata 230. However, the LTL2AUTO is a costly step, as it has been known to be exponential in the size of LTL formula FIG. 3 shows process 300, an example LTL2S process in which a given PSL formula is transformed to SERE implication form using LTL2S. Note that this is one example process with one input formula. There are many effective conversion processes that may occur depending on the input formula and the number of times the rules are applied. This example should in no way limit the scope of the claims. In process action 302, the PSL formula 312 is input. Process action 304 applies Rule 1 to the PSL formula 312 and creates formula 314. Process action 306 applies Rule 5 to formula 314 and creates formula 316. Process action 308 applies Rule 5 plus simplification for the implication "→" and creates formula 318. Process action 310 applies Rule 6 plus conversion of 'always' into 'W' to formula 318 to create formula 320. The resulting formula 320, is to be used in verification by formal and simulation engines and is represented in FIG. 4.

The number of times the rules may be applied to one formula depends on the size of the formula. The rules are applied in bottom-up fashion, starting at innermost sub-formula. At each step there is a constant increase in the size of the formula, hence the LTL2S is polynomial in size to the LTL formula, as opposed to the exponential size of traditional methods.

Figure 5:
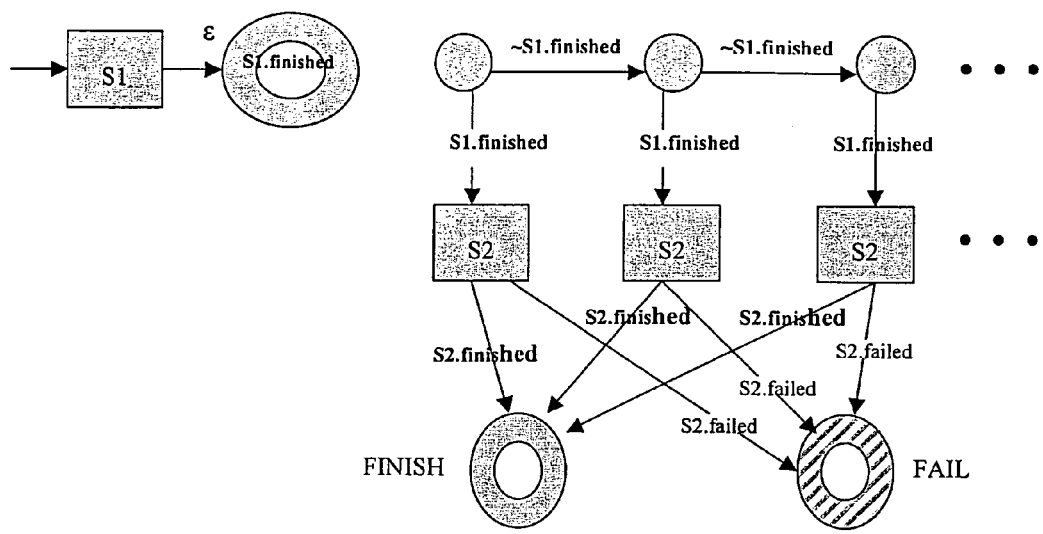
FIG. 5 is a generic SERE2AUTO process

Automata creation from SERE implication is shown in FIG. 5. S1 and S2 are automation representing corresponding regular expressions. S1.finished is generated, when a match for S1 is obtained. Once a match of S1 is obtained then there is an obligation by formula to get a match for S2. Each match of S1 generates a separate obligation for a match of S2. These are checked in parallel. The parallelism in a match of S2 can be achieved by starting a match on a separate-copy of S2. Dynamic copies of S2 are created in simulation. 'S2.failed' is reached, when a match for 'S2', starting with 'S1.finished' has failed. 'S2.finished' is reached, when a word of 'S2' is matched starting with 'S1.finished'. Simulation engines handle deterministic finite automatons. In one embodiment, they could be extended to handle non-deterministic finite automatons. However they cannot handle Buchi automatons, which describe infinite length sequences. PSL defines semantics of LTL and SERE implication properties on a finite-path. A simulation engine is used to find a failure or witness of a property. The SERE2AUTO procedure provides a construction FIG. 5, which also can be used in simulation. An execution path to 'S2.failed' shows a failure, and an execution path to 'S2.finished' shows a witness sequence.

The following is the Backus-Naur Form (BNF) for FL property using SERE implication.

---

FL_Property :: {SERE} |-> {SERE}!
    | {SERE} |-> {SERE}

---

In the above productions '{SERE}|→{SERE}!' is called strong SERE implication and '{SERE}|→{SERE}' a weak SERE implication.

A strong SERE implication holds on a given path if one of the following conditions is met:

Left hand side (LHS) SERE does not match starting at initial cycle of the path.

Right hand side (RHS) SERE matches starting at cycle S, if a word of LHS SERE matches from initial cycle to S.

This means that for every (complete) match of LHS SERE, there exists a (complete) match of RHS SERE.

A weak SERE implication holds on a given a path if one of the following conditions is met:

Left hand side (LHS) SERE does not match starting at initial cycle of the path.

Right hand side (RHS) SERE matches starting at a cycle S or a match is in progress starting at S, if a word of LHS SERE matches from initial cycle to S.

This means that for every (complete) match of LHS SERE, a match is in progress or a match for RHS SERE is obtained.

Automation for SERE Implication (Strong)

As per semantics, for every match of LHS SERE, a match of RHS SERE should be obtained. A regular expression matcher with a basic LTL formula can capture this semantic. The following rewrite rules describe synthesis of SERE implication into automation and an LTL formula.

```
{LHS} |-> {RHS}! ::
    AUTO: (init) ->{LHS}->(inter)->{RHS}
    LTL: inter -> F(RHS.finished)
```

'AUTO' is an instance of automation (regular expression matcher) and 'LTL' is an instance of a basic LTL formula. In one embodiment, from initial state 'init', there is epsilon transition to LHS automation. From the final state of LHS, there is an epsilon transition to the intermediate state 'inter'. From the state 'inter', there is an epsilon transition to the RHS automation. As per the semantics of SERE implication, once a match reaches 'inter', it should reach the final state of RHS (RHS.finished). This condition is captured in the LTL formula. This basic LTL formula (or condition) is implemented directly into simulation and model checking engines.

In another embodiment, abort is a special construct in PSL. It can be applied on an FL formula. If abort condition is true at a cycle then there is no obligation on formula in that cycle or cycles following that cycle. The following rewrite rule describes synthesis of SERE implication with abort into automation and a basic LTL formula.

```
{LHS} |-> {RHS}! abort c ::
    AUTO:(init) ->{LHS abort c} ->(inter) ->{RHS abort c}
    LTL: inter -> F(RHS.finished )
```

Abort on formula is transformed as reset condition on the LHS and RHS automatons. When reset condition is true, all the matches in progress are discarded. In an embodiment, the automation generates a 'finished' flag at the reset condition.

Automation for SERE Implication (Weak)

The following rewrite rules capture semantics of weak SERE implication.

```
{LHS} |-> {RHS}::
    AUTO:(init) ->{LHS} ->(inter) ->{RHS}
    LTL: G(!RHS.failed)
```

'AUTO' is an instance of automation and 'LTL' is an instance of a basic LTL formula. The composition of automata is similar to automata in the "Automation for SERE implications (Strong)" section. The composition of automata is shown in FIG. 5. The automta should never produce 'RHS.failed'. This is captured by a basic LTL formula 'LTL'. This condition is directly coded in verification engines.

The following rewrite rules capture semantics of weak SERE implication with abort.

```
{LHS} |-> {RHS} abort c ::
    AUTO:(init) ->{LHS abort c} ->(inter) ->{RHS abort c}
    LTL: G(!RHS.failed)
```

As with strong SERE implication, abort is captured as reset condition of LHS and RHS automatons.

PSL FL to SERE Implication

'Simple-subset' of PSL-FL has the following productions in a basic set.

```
FL_property:: {SERE} |-> {SERE}
            | {SERE} |-> {SERE}!
            | next ( FL_property )
            | FL_property Until Boolean
            | FL_property Until! Boolean
            | Boolean
            | never SERE
            | eventually! SERE
            | Boolean OR FL_property
            | Boolean AND FL_property
            | Boolean -> FL_property
            | Boolean <-> Boolean
            | Boolean before Boolean
            | NOT Boolean
            | Boolean
```

The semantics of SERE implication formula were defined in the "SERE Implication" section (0031-0036). In the following section, the semantics of productions other than SERE implications are described. It is demonstrated that SERE implication can capture the semantics of all these productions.

A 'next (FL_property)' property holds starting current cycle if 'FL_property' holds starting in next cycle.

A 'FL_property Until boolean' property holds starting in the current cycle if:

'FL_property' holds from the current cycle. OR

'Boolean' holds in the current or in some future cycle and 'FL_property' holds upto the cycle in which 'Boolean' holds.

A 'FL_property Until! Boolean' property holds starting in the current cycle if:

'Boolean' holds in the current or some future cycle. AND

'FL_property' holds upto the cycle in which 'Boolean' holds.

'never SERE' is equivalent to 'SERE|→{1'b0}' and 'eventually! SERE' is equivalent to '{1'b1}|→{[*];SERE}!'. 'before' on boolean is represented using 'Until'.

The rest of the productions use logical operators. The logical operators are evaluated from left to right. The RHS of a logical operator is allowed to be an 'FL_property'. Logical operators have their standard semantics.

Each of these productions can be converted to SERE implication forms. This is done by rewrite rules, which are described below.

Definitions

Let a, b, c and d be boolean variables. Let T and F be boolean constants TRUE and FALSE; let S1, S2, S3, and S4 be SEREs.

The basic LTL operators i.e ('X' (next), 'U'(until!) and 'W'(until)) on boolean variables can be transformed to SERE implication. These basic operators on SERE implication can be transformed to a set of SERE implication. All other LTL operators can be written in terms of basic LTL operators. Thus this set completes the rewrite rules for LTL operators to SERE implication.

TABLE 1

Rewrite rules for LTL operators to SERE implications.

| LTL English | LTL-Basic |
|---|---|
| always(b) or G(b) | (b) W (F) |
| never(b) or G(~b) | (~b) W (F) |
| eventually!(b) or F(b) | (T) U (b) |
| a until b | (a) W (b) |
| a until! b | (a) U (b) |
| a before b | (~b) W (a) |
| next(b) | X (b) |

The format of following rewrite rules is a BNF production 'LHS::RHS'. This represents LHS FL as equivalent to RHS FL. The equivalence can be shown by equivalence of automata constructed for LHS and RHS FLs.

Figure 6:
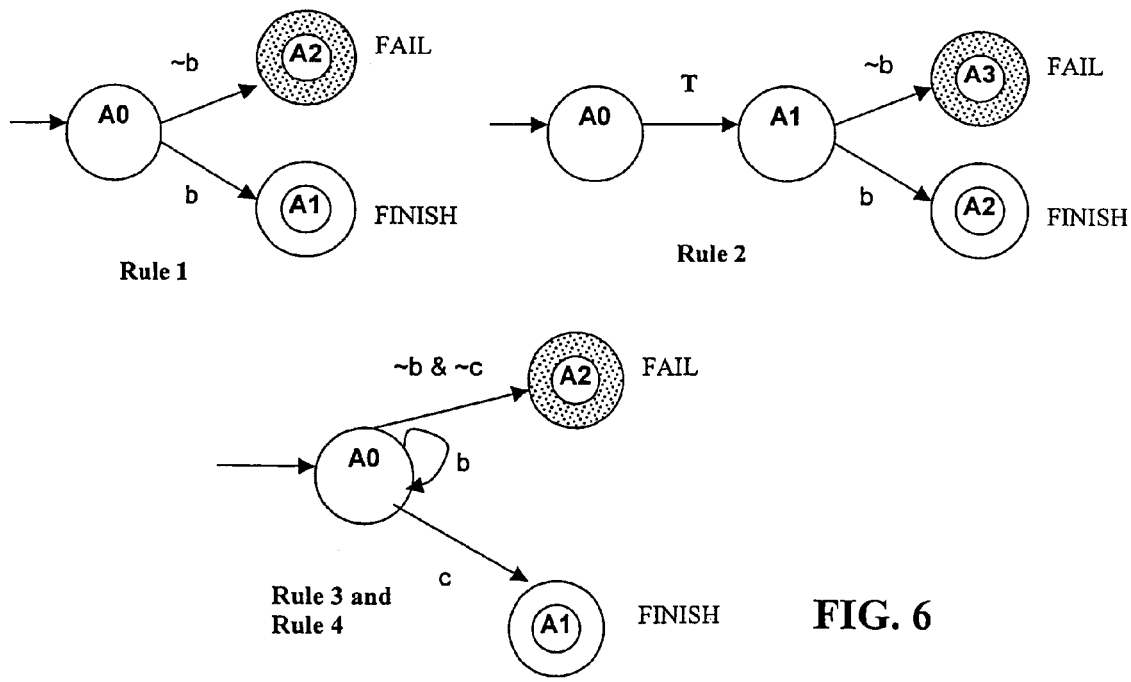
FIG. 6 illustrates the automation for rewrite rules for LTL operators in Boolean operands.

Rewrite rules for LTL operators on Boolean operands are listed below and the automation is illustrated in FIG. 6.

Rule 1: (b)::{T}|→{b}
Rule 2: X(b)::{T;T}|→{b}
Rule 3: (b) U c::{T}|→{b[*]; c}!
Rule 4: (b) W c::{T}|→{b[*]; c}

RHS of rewrite rule is a SERE implication.

Figure 7:
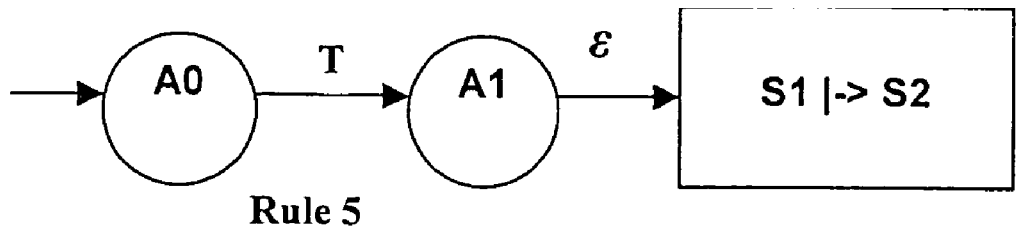
FIG. 7 illustrates the automation for rewrite rules for LTL operators on SERE implication.
Figure 7:
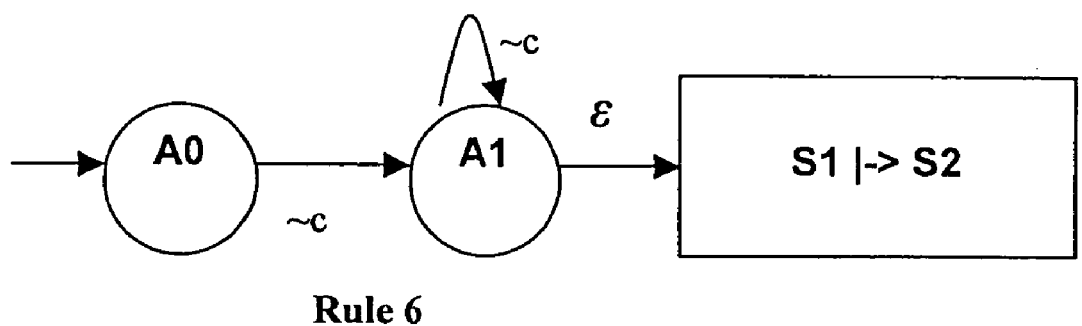
Figure 7:
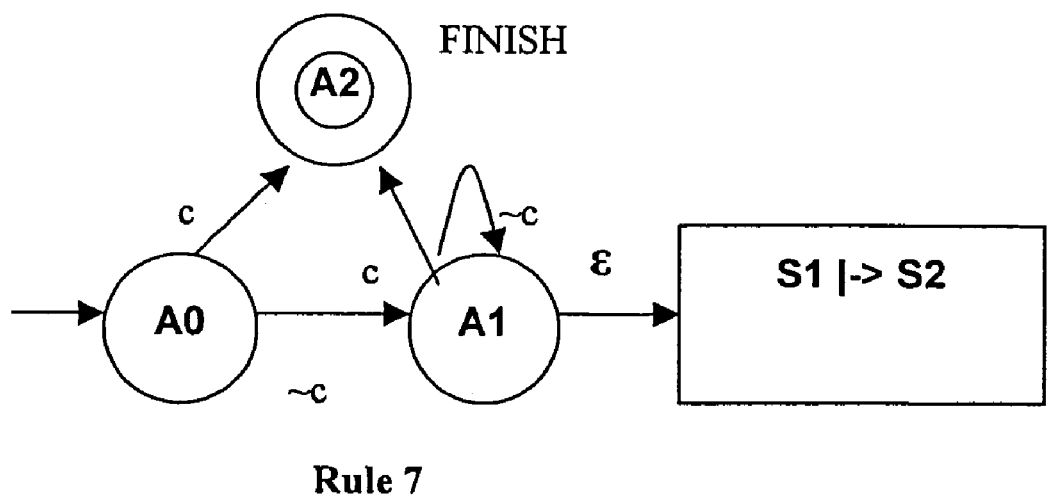

Rewrite rules for LTL operators on SERE implication are listed below and the automation is illustrated in FIG. 7.

Rule 5: X({S1}|→{S2})::{T;S1}|→{S2}
Rule 6: ({S1}|→{S2}) W c::{{!c[+]}:S1}|→{S2}
Rule 7: ({S1}|→{S2}) U c::{T}|→{T[*]; c}! AND {{!c[+]}:S1}|→{S2}

In the above rules, the LTL operators are applied to SERE implication '{S1}|→{S2}'. 'X' on SERE implication results in delaying the LHS match for one cycle. Weak until 'W' on '{S1}|→{S2}' results in change in LHS SERE. The LHS SERE matches start upto the cycle in which 'c' happens. Strong until 'U' requires that 'c' must happen some time in the future. This is captured by formula '{T}|→{T[*]; c}!'.

LTL operators are distributive over 'AND', and captured by following transformation. This 'and' is generated in Rule-7.

LTL_OP(({S1}||→{S2}) AND ({S3}|→{S4}))::  LTL_OP ({S1}|→{S2}) AND LTL_OP({S3}|→{S4}), where LTL_OP is X LTL_OP(({S1}||→{S2}) AND ({S3}|→{S4}), b)::  LTL_OP ({S1}|→{S2}, b) AND LTL_OP({S3}|→{S4}, b), where LTL_OP is U or W.

The following rules are applicable for strong form of SERE implication. The automation is illustrated in FIG. 7. The basic LTL procedure of paragraph 37 is applied on this automation to capture semantics of strong.

Rule 8: X({S1}|→{S2}!)::{T;S1}|→{S2}!
Rule 9: ({S1}|→{S2}!) W c::{{!c[+]}:S1}|→{S2}!
Rule 10: ({S1}|→{S2}!) U c::{T}|→{T[*]; c}! AND {{!c[+]}:S1}|→{S2}!

Figure 8:
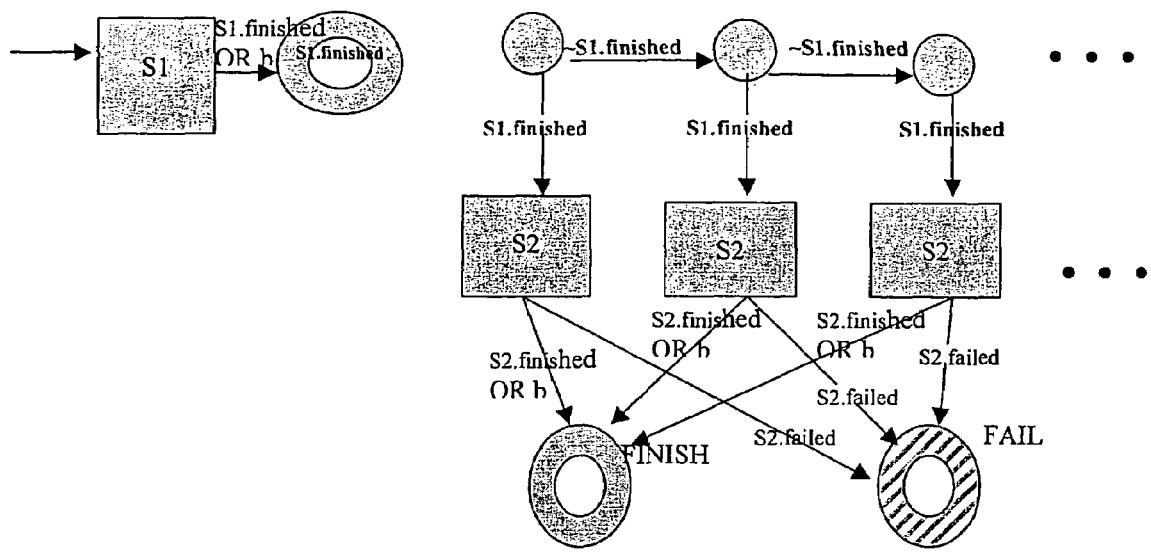
FIG. 8 illustrates the automation for SERE implication with 'abort
Figure 9:
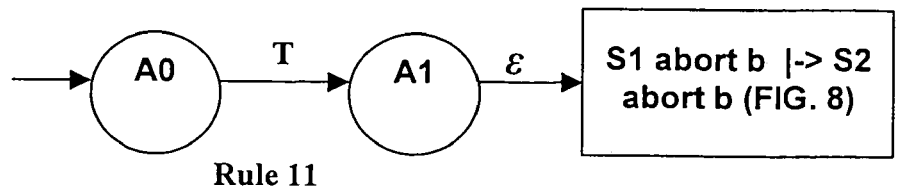
'
FIG. 9 illustrates the automation for rewrite rules for 'abort' being applied to part of the SERE implication.
Figure 9:
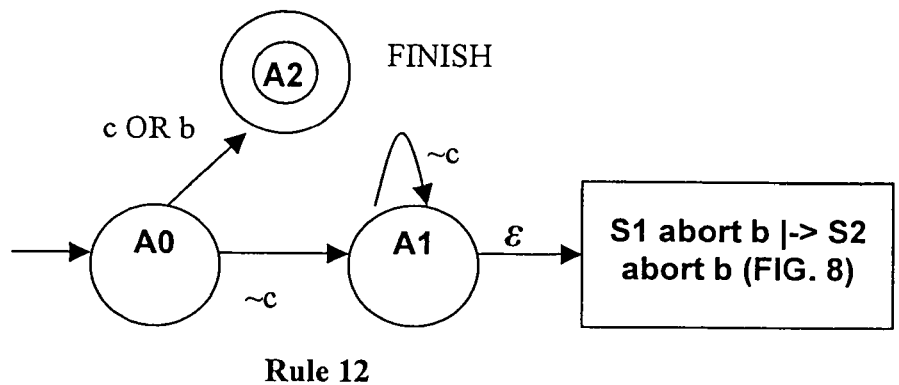
Figure 9:
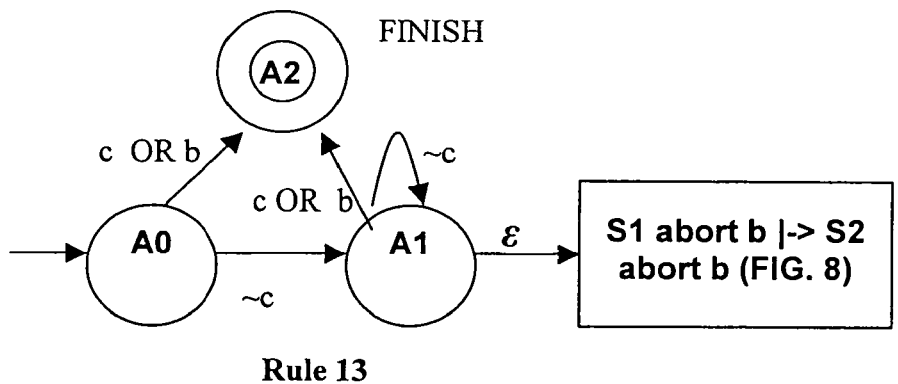

In the following rules, 'abort' is applied to part of the SERE. This has reset semantics on automation for that part of the SERE. If there are multiple 'abort' on SERE, the conditions are disjuncted. FIG. 8 illustrates the automation for SERE implication with 'abort. The rules are illustrated in FIG. 9.

Rule 11: X(({S1}|→{S2}) abort b)::{T;S1 abort b}|→{S2 abort b}
Rule 12: (({S1}|→{S2}) abort b) U c::{T}|→{T[*]; c}! and {{!c[+]}:S1 abort b }|→{S2 abort b}
Rule 13: (({S1}|→{S2}) abort b) W c::{{!c[+]}:S1 abort b }|→{S2 abort b}

Optimization Rules

These rules are simple semantic preserving opportunistic optimization rules. The intent is to optimize the size of SERE. Example optimization rules include Trivially True and Trivially False Formula, Simple FL Optimization, and Direct Model Checking Optimization.

Trivially True and Trivially False Formula occurs when constant folding and basic boolean optimizations result in LHS or RHS being trivially true or false. Some of the cases in this category are as follows A false element in LHS SERE implies formula to be true.
A null or true RHS SERE results in formula to be trivially true.

Simple FL Optimization rules are applied to convert simple FL to Boolean formula. The objective is to optimize the size of final SERE.

```
{a} |-> {b} :: ( a -> b )
(!a -> (b) abort a ) :: ( !a -> b )
{ S1; a[*] ; a[*]; S2} :: {S1 ; a[*]; S2}
{ S1; a[*i]; a[*]; S2 } :: {S1 ; a[*]; a[*i]; S2 }
{ (FL abort c) abort d } :: { FL abort(c||d) }
{ S1; 1'b0 ; S2} :: { S1; 1'b0 }
```

Direct Model Checking Optimizations ensure that basic LTL formulas written as SERE implication are recognized and represented using model checking procedure directly. For example '{T[*]|||→{b}' is recognized as basic LTL property 'G(b)'. Using these optimizations a SERE implication formula is checked by a direct model checking procedure.

```
{T[*]} |-> {b} :: G(b)
{T[*]; b} |-> {F} :: G(~b)
{T} |-> {T[*]; b }! :: F(b)
{T} |-> {a[*]; b}! :: (a U b)
```

Application to Emulation

Emulation requires representation of design and assertion as logic gates (e.g. AND, OR, NOT) and state elements (e.g. LATCH, FLIP-FLOP). The input to an emulation system is a design described in Hardware Description Languages (e.g. Verilog, VHDL, System Verilog) and assertions described in property specification language (e.g. PSL, SVA). The design is synthesized into logic gates and state element using a synthesis tool. The assertion can also be synthesized into logic gates and state elements as follows:

Convert Assertion into automation using process '200', conversion of automata using shared SEREAUTO. The generated automation is non-deterministic.

Use standard non-deterministic automation to deterministic automation conversion method.

Use standard synthesis of deterministic automation into logic gate and state-elements.

Application for System Verilog Assertions

System Verilog provides language construct parallel to PSL to describe assertions. These are called 'System Verilog Assertions'. There are two forms of assertion, 'Immediate Assertions' and 'Concurrent Assertions'. An 'Immediate Assertion' is used inside procedural code and primarily used in simulation. 'Concurrent Assertions' describes multi-cycle behavior and has regular expression based formulation parallel to PSL. 'Concurrent Assertions' are used in simulation and model checking. The construction of FIG. 5 is applicable to 'Concurrent Assertions' as well.

System Architecture Overview

Figure 10:
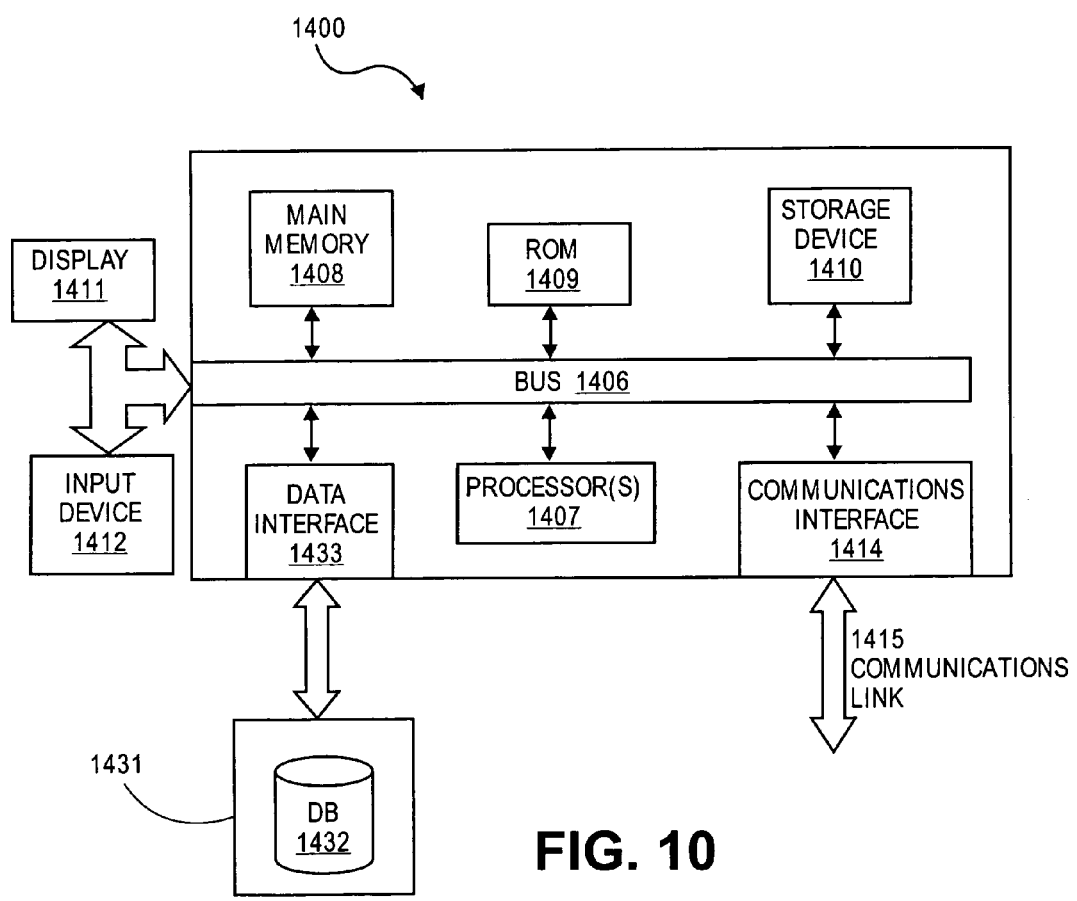
FIG. 10 is an example system in which the described embodiments would take place.

The execution of the sequences of instructions required to practice the embodiments may be performed by a computer system 1400 as shown in FIG. 10. In an embodiment, execution of the sequences of instructions is performed by a single computer system 1400. According to other embodiments, two or more computer systems 1400 coupled by a communication link 1415 may perform the sequence of instructions in coordination with one another. Although a description of only one computer system 1400 will be presented below, however, it should be understood that any number of computer systems 1400 may be employed to practice the embodiments.

A computer system 1400 according to an embodiment will now be described with reference to FIG. 10, which is a block diagram of the functional components of a computer system 1400. As used herein, the term computer system 1400 is broadly used to describe any computing device that can store and independently run one or more programs.

Each computer system 1400 may include a communication interface 1414 coupled to the bus 1406. The communication interface 1414 provides two-way communication between computer systems 1400. The communication interface 1414 of a respective computer system 1400 transmits and receives electrical, electromagnetic or optical signals, that include data streams representing various types of signal information, e.g., instructions, messages and data. A communication link 1415 links one computer system 1400 with another computer system 1400. For example, the communication link 1415 may be a LAN, in which case the communication interface 1414 may be a LAN card, or the communication link 1415 may be a PSTN, in which case the communication interface 1414 may be an integrated services digital network (ISDN) card or a modem, or the communication link 1415 may be the Internet, in which case the communication interface 1414 may be a dial-up, cable or wireless modem.

A computer system 1400 may transmit and receive messages, data, and instructions, including program, i.e., application, code, through its respective communication link 1415 and communication interface 1414. Received program code may be executed by the respective processor(s) 1407 as it is received, and/or stored in the storage device 1410, or other associated non-volatile media, for later execution.

In an embodiment, the computer system 1400 operates in conjunction with a data storage system 1431, e.g., a data storage system 1431 that contains a database 1432 that is readily accessible by the computer system 1400. The computer system 1400 communicates with the data storage system 1431 through a data interface 1433. A data interface 1433, which is coupled to the bus 1406, transmits and receives electrical, electromagnetic or optical signals, that include data streams representing various types of signal information, e.g., instructions, messages and data. In embodiments, the functions of the data interface 1433 may be performed by the communication interface 1414.

Computer system 1400 includes a bus 1406 or other communication mechanism for communicating instructions, messages and data, collectively, information, and one or more processors 1407 coupled with the bus 1406 for processing information. Computer system 1400 also includes a main memory 1408, such as a random access memory (RAM) or other dynamic storage device, coupled to the bus 1406 for storing dynamic data and instructions to be executed by the processor(s) 1407. The main memory 1408 also may be used for storing temporary data, i.e., variables, or other intermediate information during execution of instructions by the processor(s) 1407.

The computer system 1400 may further include a read only memory (ROM) 1409 or other static storage device coupled to the bus 1406 for storing static data and instructions for the processor(s) 1407. A storage device 1410, such as a magnetic disk or optical disk, may also be provided and coupled to the bus 1406 for storing data and instructions for the processor(s) 1407.

A computer system 1400 may be coupled via the bus 1406 to a display device 1411, such as, but not limited to, a cathode ray tube (CRT), for displaying information to a user. An input device 1412, e.g., alphanumeric and other keys, is coupled to the bus 1406 for communicating information and command selections to the processor(s) 1407.

According to one embodiment, an individual computer system 1400 performs specific operations by their respective processor(s) 1407 executing one or more sequences of one or more instructions contained in the main memory 1408. Such instructions may be read into the main memory 1408 from another computer-usable medium, such as the ROM 1409 or the storage device 1410. Execution of the sequences of instructions contained in the main memory 1408 causes the processor(s) 1407 to perform the processes described herein. In alternative embodiments, hard-wired circuitry may be used in place of or in combination with software instructions. Thus, embodiments are not limited to any specific combination of hardware circuitry and/or software.

The term "computer-usable medium," as used herein, refers to any medium that provides information or is usable by the processor(s) 1407. Such a medium may take many forms, including, but not limited to, non-volatile, volatile and transmission media. Non-volatile media, i.e., media that can retain information in the absence of power, includes the ROM 1409, CD ROM, magnetic tape, and magnetic discs. Volatile media, i.e., media that can not retain information in the absence of power, includes the main memory 1408. Transmission media includes coaxial cables, copper wire and fiber optics, including the wires that comprise the bus 1406. Transmission media can also take the form of carrier waves; i.e., electromagnetic waves that can be modulated, as in frequency, amplitude or phase, to transmit information signals. Additionally, transmission media can take the form of acoustic or light waves, such as those generated during radio wave and infrared data communications.

In the foregoing specification, the embodiments have been described with reference to specific elements thereof. It will, however, be evident that various modifications and changes may be made thereto without departing from the broader spirit and scope of the embodiments. For example, the reader is to understand that the specific ordering and combination of process actions shown in the process flow diagrams described herein is merely illustrative, and that using different or additional process actions, or a different combination or ordering of process actions can be used to enact the embodiments. The specification and drawings are, accordingly, to be regarded in an illustrative rather than restrictive sense.

We claim:

1. A computer implemented method for transforming a formula for verification of circuit design, comprising:

inputting a property specification language formula, the formula comprising a plurality of forms;

applying one or more of a set of transformation rules to transform the property specification language formula into a regular expression implication, the regular expression implication being of one form; and applying one or more of a set of optimization rules to the regular expression implication to reduce the size,
wherein the optimized regular expression implication is used in verification by formal or simulation engines.

2. The method of claim 1, wherein the property specification language is PSL.

3. The method of claim 1, wherein the property specification language is Systems Verilog Assertions (SVA).

4. The method of claim 1, wherein the property specification language is Linear Temporal Logic (LTL).

5. The method of claim 1, wherein the engine is an emulation engine.

6. The method of claim 1, wherein the set of transformation rules includes a set of rules for Linear Temporal Logic (LTL) operators on Boolean operands.

7. The method of claim 6, wherein the set of rules for LTL operators on Boolean operands comprises:
Rule 1: (b)::{T}|fwdarw.{b}
Rule 2: X(b)::{T;T}|fwdarw.{b}
Rule 3: (b) U c::{T}|fwdarw.{b[*];c}!; and
Rule 4: (b) W c::{T}|fwdarw.{b[*]; c}.

8. The method of claim 1, wherein the set of transformation rules includes a set of rules for LTL operators in regular expression implications.

9. The method of claim 8, wherein the set of rules for LTL operators in regular expression implications comprises:
Rule 5: X({S1}|fwdarw.{S2})::{T;S1}|fwdarw.{S2}
Rule 6: ({S1}|fwdarw.{S2}) W c::{{!c[*]}: S1}|fwdarw.{S2}; and
Rule 7: ({S1}|fwdarw.{S2}) U c::{T}|fwdarw.{T[*]; c}AND {{!c[+]}:S1}|fwdarw.{S2}.

10. The method of claim 1, wherein the set of transformation rules includes a set of rules for strong form of regular expression implications.

11. The method of claim 10, wherein the set of rules for strong form of regular expression implication comprises:
Rule 8: X({S1}|fwdarw.{S2}!)::{T;S1}|fwdarw.{S2}!;
Rule 9: ({S1}|fwdarw.{S2}!) W c::{{!c[+]}: S1}|fwdarw.{S2}!; and
Rule 10: ({S1}|fwdarw.{S2}!) U c::{T}|fwdarw.{T[*]; c}! AND {{!c[+]}:S1}|fwdarw.{S2}!.

12. The method of claim 1, wherein the set of transformation rules includes a set of rules for 'abort' to be applied to part of the regular expression implication.

13. The method of claim 12, wherein the set of rules for 'abort' to be applied to part of the regular expression implication comprises:
Rule 11: X(({S1}|fwdarw.{S2}) abort b)::{T;S1 abort b}|fwdarw.{S2 abort b};
Rule 12: (({S1}|fwdarw.{S2}) abort b) U c::{T}|fwdarw.{T[*]; c}! and {{!c[+]}:S1 abort b}|fwdarw.{S2 abort b}; and
Rule 13: (({S1}|fwdarw.{S2}) abort b) W c::{{!c[+]}:S1 abort b}|fwdarw.{S2 abort b}.

14. The method of claim 13, wherein conditions are disjuncted if multiple 'abort' are applied on regular expression implications.

15. The method of claim 1, wherein the set of optimization rules comprises: trivially true and trivially false formula rules, simple Foundation Language (FL) optimization rules, and direct model checking optimization rules.

16. The method of claim 15, wherein the trivially true and trivially false formula rules include at least:
a false element in a left-hand-side regular expression implication implies a value of TRUE; and
a null or true right-hand-side regular expression implication results in a value of TRUE.

17. The method of claim 15, wherein the simple FL optimization rules convert simple FL to Boolean formula.

18. The method of claim 15, wherein the simple FL optimization rules optimize the size of formula.

19. The method of claim 15, wherein the simple FL optimization rules comprises:

{a} |-> {b} :: ( a -> b ) ;
(!a -> (b) abort a ) :: ( !a -> b ) ;
{ S1; a[*] ; a[*]; S2 } :: {S1 ; a[*]; S2 } ;
{ S1; a[*i]; a[*]; S2 } :: {S1 ; a[*]; a[*i]; S2 } ;
{ (FL abort c) abort d } :: { FL abort(c||d) } ; and
{ S1; 1'b0 ; S2} :: { S1; 1'b0 } .

20. The method of claim 15, wherein the direct model checking optimization rules ensure that the regular expression implications are recognized and checked by a direct model checking procedure.

21. The method of claim 15, wherein the direct model checking optimization rules comprises:

{T[*]} |-> {b} :: G(b) ;
{T[*]; b} |-> {F} :: G(~b) ;
{T} |-> {T[*]; b }! :: F(b) ; and
{T} |-> {a[*]; b}! :: (a U b) .

22. A method of converting a simple subset formula into a regular expression implication for model checking and simulation, the method comprising:
applying a set of rules to the simple subset formula, the rules preserving the semantics of the simple subset formula while transforming the formula into regular expression implication; and
applying one or more of a set of optimization rules to the regular expression implication to reduce the size,
wherein the optimized regular expression implication is used in verification by formal or simulation engines.

23. The method of claim 22, further comprising:
providing automata construction to support regular expression implication by simulation and formal engine.

24. The method of claim 23, wherein the automata construction is shared for Linear Temporal Logic (LTL) and regular expression implication parts of a formula.

25. The method of claim 22, wherein the application of the set of rule is performed in a bottom up fashion.

26. A system for transforming a formula in a simple-subset for model checking and simulation, comprising:
means for inputting a property specification language formula, the formula comprising a plurality of forms;
means for applying one or more of a set of transformation rules to transform the property specification language formula into a regular expression implication, the regular expression implication being of one form; and
means for applying one or more of a set of optimization rules to the regular expression implication to reduce the size,
wherein the optimized regular expression implication is used in verification by formal or simulation engines.

27. The system of claim 26, wherein the property specification language is PSL.

28. The system of claim 26, wherein the property specification language is Systems Verilog Assertions (SVA).

29. The system of claim 26, wherein the property specification language is Linear Temporal Logic (LTL).

30. The system of claim 26, wherein the engine is an emulation engine.

31. The system of claim 26, wherein the set of transformation rules includes rules for Linear Temporal Logic (LTL) operators on Boolean operands.

32. The system of claim 31, wherein the rules for LTL operators on Boolean operands comprises:
Rule 1: (b)::{T}|fwdarw.{b};
Rule 2: X(b)::{T;T}|fwdarw.{b};
Rule 3: (b) U c::{T}|fwdarw.{b[*];c}!; and
Rule 4: (b) W c::{T}|fwdarw.{b[*]; c}.

33. The system of claim 26, wherein the set of transformation rules includes rules for LTL operators in regular expression implications.

34. The system of claim 33, wherein the rules for LTL operators in regular expression implications comprises:
Rule 5: X({S1}|fwdarw.{S2})::{T;S1}|.fwdarw.{S2};
Rule 6: ({S1}|fwdarw.{S2}) W c::{{!c[+]}:S1}|fwdarw.{S2}; and
Rule 7: ({S1}|fwdarw.{S2})Uc::{T}|fwdarw.{T[*]; c}! AND {{!c[+]}:S1}|fwdarw.{S2}.

35. The system of claim 26, wherein the set of transformation rules includes a set of rules for strong form of regular expression implications.

36. The system of claim 35, wherein the set of rules for strong form of regular expression implication comprises:
Rule 8: X({S1}|fwdarw.{S2}!)::{T;S1}|fwdarw.{S2}!;
Rule 9: ({S1}|fwdarw.{S2}!) W c::{{!c[+]}:S1}|fwdarw.{S2}!; and
Rule 10: ({S1}|fwdarw.{S2}!) U c::{T}|fwdarw.{T[*]; c}! AND {{!c[+]}:S1}|fwdarw.{S2}!.

37. The system of claim 26, wherein the set of transformation rules includes a set of rules for 'abort' to be applied to part of the regular expression implication.

38. The system of claim 37, wherein the set of rules for 'abort' to be applied to part of the regular expression implication comprises:
Rule 11: X(({S1}|fwdarw.{S2}) abort b)::{T;S1 abort b}|fwdarw.{S2 abort b};
Rule 12: (({S1}|fwdarw.{S2}) abort b) U c::{T}|fwdarw.{T[*]; c}! and {{!c[+]}:S1 abort b}|fwdarw.{S2 abort b}; and
Rule 13: (({S1}|fwdarw.{S2}) abort b) W c::{{!c[+]}:S1 abort b}|fwdarw.{S2 abort b}.

39. The system of claim 38, wherein conditions are disjuncted if multiple 'abort' are applied on regular expression implications.

40. The system of claim 26, wherein the set of optimization rules comprises: trivially true and trivially false formula rules, simple Foundation Language (FL) optimization rules, and direct model checking optimization rules.

41. The system of claim 40, wherein the trivially true and trivially false formula rules include at least: a false element in a left-hand-side regular expression implication implies a value of TRUE; and a null or true right-hand-side regular expression implication results in a value of TRUE.

42. The system of claim 40, wherein the simple FL optimization rules convert simple FL to Boolean formula.

43. The system of claim 40, wherein the simple FL optimization rules optimize the size of formula.

44. The system of claim 40, wherein the simple FL optimization rules comprises:

```
{a} |-> {b} :: ( a -> b ) ;
(!a -> (b) abort a ) :: ( !a -> b ) ;
{ S1; a[*] ; a[*]; S2 } :: {S1 ; a[*]; S2 } ;
{ S1; a[*i]; a[*]; S2 } :: {S1 ; a[*]; a[*i]; S2 } ;
{ (FL abort c) abort d } :: { FL abort(c||d) } ; and
{ S1; 1'b0 ; S2} :: { S1; 1'b0 } .
```

45. The system of claim 40, wherein the direct model checking optimization rules ensure that the regular expression implications are recognized and checked by a direct model checking procedure.

46. The system of claim 40, wherein the direct model checking optimization rules comprises:

```
{T[*]} |-> {b} :: G(b) ;
{T[*]; b} |-> {F} :: G(~b) ;
{T} |-> {T[*]; b }! :: F(b) ; and
{T} |-> {a[*]; b}! :: (a U b) .
```

47. A computer program product embodied on computer readable medium, the computer readable medium having stored thereon a sequence of instructions which, when executed by a processor, causes the processor to execute a method for a method for transforming a formula in a simple-subset for model checking and simulation, the method comprising:
inputting a property specification language formula, the formula comprising a plurality of forms;
applying one or more of a set of transformation rules to transform the property specification language formula into a regular expression implication, the regular expression implication being of one form; and
applying one or more of a set of optimization rules to the regular expression implication to reduce the size,
wherein the optimized regular expression implication is used in verification by formal or simulation engines.

48. The method of claim 47, wherein the engine is an emulation engine.

49. The method of claim 47, wherein the set of transformation rules includes a set of rules for Linear Temporal Logic (LTL) operators on Boolean operands.

50. The method of claim 47, wherein the set of transformation rules includes a set of rules for LTL operators in regular expression implications.

51. The method of claim 47, wherein the set of transformation rules includes a set of rules for strong form of regular expression implications.

52. The method of claim 47, wherein the set of transformation rules includes a set of rules for 'aborts' to be applied to part of the regular expression implication.

53. The method of claim 47, wherein the set of optimization rules comprises: trivially true and trivially false formula rules, simple Foundation Language (FL) optimization rules, and direct model checking optimization rules.

* * * * *